US006534859B1

United States Patent
Shim et al.

(10) Patent No.: US 6,534,859 B1
(45) Date of Patent: Mar. 18, 2003

(54) SEMICONDUCTOR PACKAGE HAVING HEAT SINK ATTACHED TO PRE-MOLDED CAVITIES AND METHOD FOR CREATING THE PACKAGE

(75) Inventors: Il Kwon Shim, Singapore (SG); Seng Guan Chow, Singapore (SG); Gerry Balanon, San Jose, CA (US)

(73) Assignee: St. Assembly Test Services Ltd., Singapore (SG)

( * ) Notice: Subject to any disclaimer, the term of this patent is extended or adjusted under 35 U.S.C. 154(b) by 0 days.

(21) Appl. No.: 10/116,983

(22) Filed: Apr. 5, 2002

(51) Int. Cl.[7] .................. H01L 23/495; H01L 23/10; H01L 23/28; H01L 21/50
(52) U.S. Cl. .................. 257/706; 257/675; 257/707; 257/787; 257/796; 257/783; 257/719; 438/124; 438/126; 438/127; 438/106; 438/122
(58) Field of Search .................. 257/675, 707, 257/787, 796, 783, 706, 719; 438/124, 126, 127, 106

(56) References Cited

U.S. PATENT DOCUMENTS

| | | | |
|---|---|---|---|
| 5,227,663 A | * 7/1993 | Patil et al. ............ | 257/718 |
| 5,371,404 A | * 12/1994 | Juskey et al. ......... | 257/659 |
| 5,641,987 A | 6/1997 | Lee .................... | 257/675 |
| 5,785,799 A | * 7/1998 | Culnane et al. ....... | 156/379.7 |
| 5,834,839 A | 11/1998 | Mertol ................ | 257/704 |
| 5,866,953 A | * 2/1999 | Akram et al. ......... | 257/790 |
| 5,872,395 A | 2/1999 | Fujimoto .............. | 257/675 |
| 5,891,753 A | * 4/1999 | Akram ................. | 438/108 |
| 5,977,626 A | * 11/1999 | Wang et al. ........... | 257/707 |
| 6,069,023 A | * 5/2000 | Bernier et al. ........ | 438/107 |
| 6,150,193 A | * 11/2000 | Glenn ................. | 438/113 |
| 6,191,360 B1 | * 2/2001 | Tao et al. ............ | 174/52.4 |
| 6,201,301 B1 | 3/2001 | Hoang ................. | 257/712 |
| 6,229,702 B1 | * 5/2001 | Tao et al. ............ | 361/704 |
| 6,316,829 B1 | * 11/2001 | Boon et al. ........... | 257/730 |
| 6,462,405 B1 | * 10/2002 | Lai et al. ............ | 257/675 |

* cited by examiner

Primary Examiner—Albert W. Paladini
Assistant Examiner—James Mitchell
(74) Attorney, Agent, or Firm—George O. Saile; Stephen B. Ackerman

(57) ABSTRACT

A new method and package is provided for face-up packaging of semiconductor devices. The semiconductor device is mounted over the surface of a semiconductor device support surface using conventional methods of device packaging up through device bond wire interconnect to electrical traces on the surface of the semiconductor device support surface over which the device is mounted. An internal mold cap is formed over the device, the internal mold cap has an opening exposing the surface of the device. An external mold cap is formed surrounding the internal mold cap with a cavity separating the external mold cap from the internal mold cap. Thermally conductive epoxy is deposited in the opening of the internal mold cap and in the cavity between the internal and the external mold cap. The heat spreader is placed and attached after which a thermal epoxy and mold cure is applied to the package. The package is further completed by the application of contact balls to a first surface of the semiconductor device support surface, the semiconductor devices is mounted has been mounted over a second surface of the semiconductor device support surface.

63 Claims, 5 Drawing Sheets

SEMICONDUCTOR PACKAGE HAVING HEAT SINK ATTACHED TO PRE-MOLDED CAVITIES AND METHOD FOR CREATING THE PACKAGE

BACKGROUND OF THE INVENTION (1) Field of the Invention

The invention relates to the fabrication of integrated circuit devices, and more particularly, to a method and package for thermally improved Plastic Ball Grid Array (PBGA) packaging.

(2) Description of the Prior Art

The semiconductor industry has since its inception achieved improvements in the performance of semiconductor devices by device miniaturization and by increasing the device packaging density.

One of the original approaches that has been used to create surface mounted, high pin count integrated circuit packages has been the use of the Quad Flat Pack (QFP) with various pin configurations. For the QFP, closely spaced leads along the four edges of the flat package are used for making electrical connections from where the electrical connections are distributed to the surrounding circuitry. The input/output (I/O) connections that can be made to the QFP are therefore confined to the edges of the flat package, which limits the number of I/O connections that can be made to the QFP even in applications where the pin to pin spacing is small. The QFP has found to be cost effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package thereby eliminating the restriction of having I/O connects only around the periphery of the package. More contact points with greater spacing between the contact points can therefore be allocated across the BGA package than was the case with the QFP. The contact points that are used for the BGA package are typically solder balls that have the added advantage of facilitating flow soldering of the package onto a printed circuit board.

Prior Art substrate packaging uses ceramic and plastic BGA packaging. Ceramic substrate packaging is expensive and has proven to limit the performance of the overall package. Recent years have seen the emergence of plastic BGA packaging; this packaging has become the main stream design and is frequently used in high volume BGA package fabrication. The Plastic BGA (PBGA) package performs satisfactorily when used for low-density flip-chip IC's. If the number of pins emanating from the IC is high, that is in excess of 350 pins, or if the number of pins coming from the IC is less than 350 but the required overall package size is small, or if the chip power dissipation is high (in excess of 4 Watts per chip), the plastic structure becomes complicated and expensive.

The invention addresses concerns of thermal performance of the PBGA package that in addition provides advantages of electrical performance (such as low parasitic inductance being added by the package) and advantages of assembly (such as low cost, being a flexible solution that does not require a redesign of the substrate over which the die is mounted) while the package meets conventional manufacturing standards.

U.S. Pat. No. 5,872,396 (Fujimoto) shows a heat spreader using a mold compound and a mold cavity.

U.S. Pat. No. 5,641,987 (Lee) shows another similar heat spreader design.

U.S. Pat. No. 5,977,626 (Want et al.) U.S. Pat. No. 6,201,301 (Hoang) and U.S. Pat. No. 5,834,839 (Mertol) show related heat spreaders and methods.

SUMMARY OF THE INVENTION

A principle objective of the invention is to provide a Plastic BGA package of improved thermal performance.

Another objective of the invention is to provide an integrated circuit package of enhanced electrical performance.

Another objective of the invention is to provide an integrated circuit package of a structure that can be maintained as the current standard Plastic Ball Grid Array package format.

In accordance with the objectives of the invention a new method and package is provided for face-up packaging of semiconductor devices. The semiconductor device is mounted over the surface of a semiconductor device mounting support using conventional methods of device packaging up through device bond wire interconnect to electrical traces on the surface of the semiconductor device mounting support over which the device is mounted. An internal mold cap is formed over the device, the internal mold cap has an opening exposing the surface of the device. An external mold cap is formed surrounding the internal mold cap, with a cavity separating the external mold cap from the internal mold cap. Thermally conductive epoxy is deposited in the opening of the internal mold cap and in the cavity between the internal and the external mold cap. A heat spreader is placed and attached after which a thermal epoxy and mold cure is applied to the package. The package is further completed by the application of contact balls to a first surface of the semiconductor device mounting support, the semiconductor device has been mounted over a second surface of the semiconductor device mounting support.

BRIEF DESCRIPTION OF THE DRAWINGS

FIG. 2 shows a cross section of the Front-Of-Line (FOL) processing of the invention.

FIG. 3 shows a cross section after an internal and an external mold cap have been provided over the surface of the semiconductor device mounting support.

FIG. 4 shows a cross section after thermally conductive epoxy has been inserted into the opening in the internal mold cap and in the gap between the internal and external mold cap.

FIG. 5 shows a cross section after positioning a heat spreader over the structure.

FIG. 6 shows a cross section after the heat spreader has been attached to the structure.

FIG. 7 shows a cross section after contact balls have been attached to the semiconductor device mounting support of the package, creating a complete package.

DESCRIPTION OF THE PREFERRED EMBODIMENTS

Figure 1A:
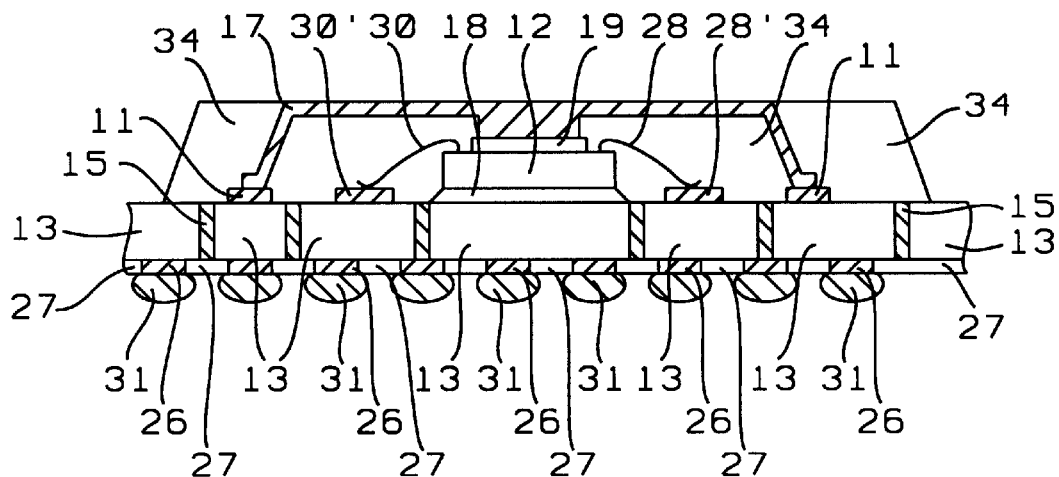
FIG. 1a shows a cross section of a first prior art BGA package.

A Ball Grid Array (BGA) is an array of solderable balls placed on a chip carrier, such as a Printed Circuit Board (PCB) or, more generically, a semiconductor device mounting support. The balls contact a printed circuit board or a semiconductor device mounting support in an array configuration where, after reheat, the balls connect the chip to the printed circuit board. BGA's are known with 40, 50 and 60 mil spacings in regular or staggered array patterns. The BGA package is part of a larger packaging approach that is often referred to as Chip Scale Packages (CSP). This is a packaging approach that is considered to be different from the Multi Chip Module (MCM) approach. In the field of high-density interconnect technology, many integrated circuit chips are physically and electrically connected to a single substrate commonly referred to as a multi-chip module (MCM). This latter approach is applied to achieve a high wiring and packaging density, whereby it is necessary to fabricate a multilayer structure on the substrate to connect integrated circuits to one another. Typically metal and power and ground planes in the substrate are separated by layers of dielectric such as a Laminate or Polyimide. Embedded in other dielectric layers are metal conductor lines within the range of about 1 to 4 mils wide with vias (holes) providing.electrical connections between signal lines or to the metal power and ground planes.

Flip Chip packages have in general been used to accommodate increased I/O count combined with increased high requirements for high performance Integrated Circuit (IC) devices. Flip chip technology fabricates bumps (typically comprising Pb/Sn solder) on aluminum pads and interconnects the bumps directly to the package media, which are usually ceramic or plastic based. The flip-chip is bonded face down to the package through the shortest paths. This approach can be applied to single-chip packaging and to higher integrated levels of packaging (in which the packages are larger) and to more sophisticated packaging media that accommodate several chips to form larger functional units.

It is required to provide adequate thermal performance of a BGA package for cavity-down and enhanced BGA devices that has a direct ground connect between the IC chip and the heatsink on the surface of which the IC chip is mounted. In a cavity down/enhanced BGA package arrangement, a substrate layer that may contain two or more layers of interconnect traces is used to connect the IC chip to surrounding circuitry using wire bond connections between the IC chip and a substrate. The contact points of a cavity down/ enhanced BGA devices make contact with contact points on the top surface of the substrate layer, the substrate re-distributes (fan-out) the cavity down/enhanced BGA device contact points. A molding is encased between the lower surface of the cavity down enhanced BGA device and the upper surface of the substrate. A heat sink is typically attached to the lower surface of the IC chip.

For purpose of packaging semiconductor devices and for addressing thermal concerns of such packages, present trend in the industry is to place increased demands on the thermal performance of packaged devices coupled with low assembly and unit cost of the completed package. Generally, these increased demands are met by following one or more of the following approaches:

- by increasing the percentage of copper that is contained in the substrate over which the device is mounted; this can be accomplished by for instance increasing the routing density of the interconnect lines over the surface of the substrate or by increasing the paddle size of the die paddle over which the devices are mounted
- by including additional layers of metal in the substrate over which the device is mounted
- by increasing the thickness of the metal planes contained in the substrate over which the device is mounted; this by for instance using a two-ounce thickness layer of copper as opposed to using a one-ounce thickness layer of copper, and
- by the addition of thermal pads, vias and solder balls over which the device is mounted.

In addition, an approach that is frequently taken is to provide for an external heat sink, which can for instance be of a pin-fin or circular design; such a heat sink can be attached to a die-up PBGA package.

Figure 1B:
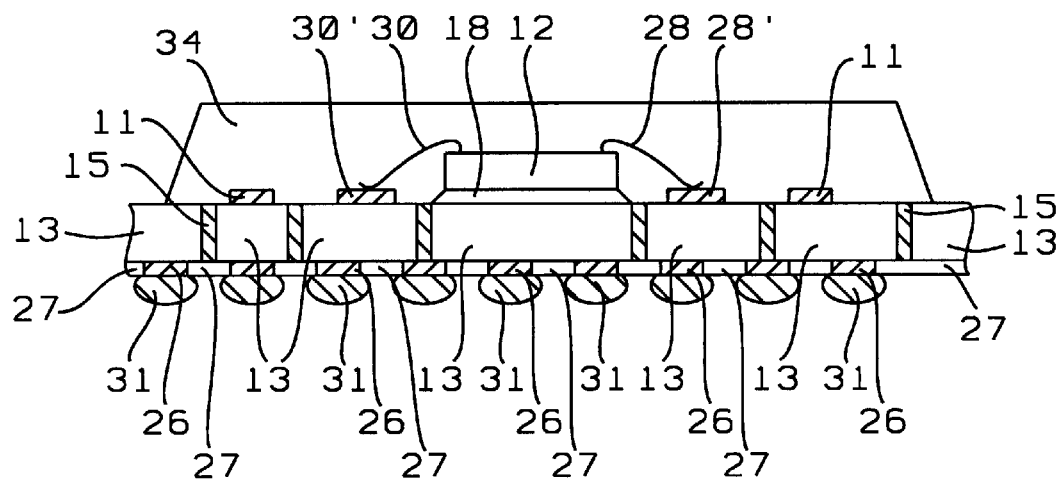
FIG. 1b shows a cross section of a second prior art BGA package.

The prior art applications that are shown in cross section in FIGS. 1a and 1b are examples of a die-up mounting method since the contact points to die 12 are mounted in an upward position. For applications where the die-up method of mounting the device does not meet thermal requirements, the die-down method is frequently used whereby substrates are used that have been provided with metal heat-distribution surfaces (heat slugs). A die-down BGA package typically has better thermal performance than the die-up PBGA package since the heat that is generated in the die can be dissipated effectively from the backside of the die to the metal heat slugs. However, the assembly cost for this die-down arrangement is considerably higher than for the die-up method of mounting semiconductor devices.

Shown in the cross section of FIG. 1a are the following elements:

- 10, the heat sink of the package
- 11, contact points provided on the surface of substrate 13
- 12, a semiconductor die mounted over the surface of
- 13, a substrate or semiconductor device mounting support
- 18, a layer of thermally conductive adhesive
- 19, a layer of thermally conductive adhesive compound that serves as a conductive path between the die 12 and heat sink 10
- 15, interconnect vias provided through substrate 13
- 26, conductive traces on a first surface of substrate 13, which are interconnected with traces 11 and 28'/30' by means of vias 15
- 27, a solder mask layer with openings that are aligned with the copper traces 26
- 28 and 30, bond wires for the interconnection of die 12 to conductive traces on the second surface of substrate 13
- 28' and 30', conductive traces on a second surface of substrate 13 to which bond wires 28/30 are connected
- 34, a mold compound 34 formed over the surface of the structure, which further also surrounds bond wires 28 and 30.

The prior art package that is shown in cross section in FIG. 1b is similar to the prior art package that has been highlighted in some detail above, the package that is shown in cross section in FIG. 1b has not been provided with heat sink 10 and the layer of thermally conductive adhesive compound 19.

FIGS. 2 through 7 are now described in detail in order to fully describe the invention.

The essential points of the invention are highlighted first, as follows:

- standard front-of-line (FOL) and end-of-line (EOL) processes and procedures are applied to assembly the low-cost thermally enhanced die-up PBGA packages of the invention
- the semiconductor device that is mounted over the second surface of the device support structure is encapsulated in two separately created molds, that is an internal mold cap and an external mold cap
- customized mold chase designs are required to form the internal and external mold caps of the package and the thereby provided cavities
- the inner mold cap is mounted aligned with the semiconductor die of the package and is provided with an opening that is set above the die of the package, exposing the surface of the die
- a cavity is provided between the internal mold cap and the external mold cap
- the internal mold cap has an exposed area to the surface of the die of the package
- thermally conductive epoxy is inserted into the opening (internal mold cap) and cavity (between the internal and the external mold cap) that have been created in and between the mold caps
- the heat sink is attached to the internal mold cap by inserting thermally conductive epoxy in the centrally located opening of the internal mold cap
- an external heat spreader is attached to the package, the periphery of the heat sink can be attached to the cavity that is formed between the internal and the external mold cap using thermally conductive epoxy
- the heat sink can be connected to ground pads which are provided in or on the surface of the underlying substrate of the package; the ground pads are provided in the surface of the substrate that is exposed by the cavity between the internal and the external mold cap; electrically conducive epoxy can be used for this purpose, thus forming a ground plane and a partial EMI shield in the package; interconnect wires can also be used for this purpose
- the external mold cap is higher than the internal mold cap in order to maintain the package profile that conforms to the standard PBGA package when the heat sink overlies the internal mold cap
- the external mold cap serves as a dam at the time that the thermally conductive epoxy is deposited in the cavity between the internal and the external mold cap
- in a further improved version of the invention, the heat sink can be provided with a downward protruding pedestal at the center of the heat sink, this pedestal can be matched with cavity provided in the internal mold cap for further improvement of the thermal performance of the package
- in a further improved version, the heat sink can externally extend over the outside surfaces of the external mold cap
- curing is applied to the package by applying a post-mold cure process, simultaneously curing the mold compound and the thermally conductive epoxy of the package
- the invention allows for an optimized heat spreader design whereby the design of the heat spreader has no effect on the assembly of the package.

Figure 2:
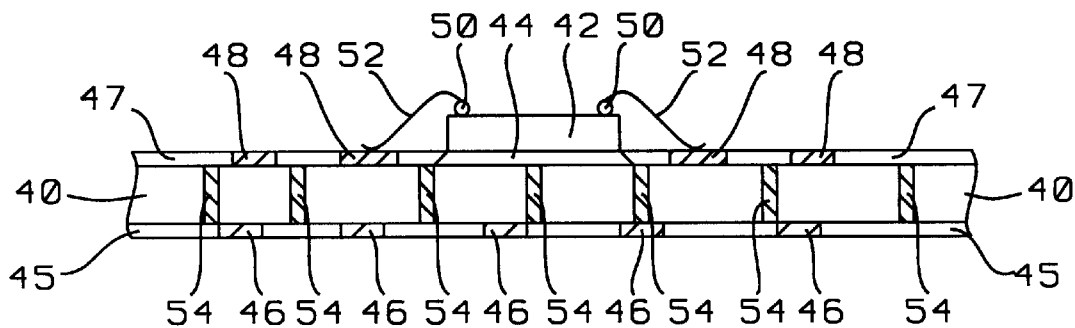
FIGS. 2 through 7 show the processing sequence of the invention, as follows.

Referring now specifically to FIG. 2, there is shown a cross section of a partially completed semiconductor device package comprising the following elements:

- 40, a substrate or device mounting support over the surface of which semiconductor devices are mounted
- 42, a semiconductor device that is mounted over the surface of substrate 40
- 44, an adhesive interface between the die 42 and substrate 40
- 45, a solder mask applied over a first surface of substrate 40
- 46, interconnect traces created over the first surface of substrate 40
- 47, a solder mask applied over a second surface of substrate 40
- 48, interconnect traces created over the second surface of substrate 40
- 50, contact balls created over the active surface of device 42, these solder bumps serve to establish electrical contact with device 42
- 52, bond wires that interconnect ball bonds 50 with interconnect traces 48
- 54, conductive vias that establish electrical continuity between interconnect traces 46 and interconnect traces 48.

The structure that is shown in cross section in FIG. 2 is the end result of the above referred to and standard front-of-line (FOL) processing of the PBGA package. It must be pointed out that one or more layers of interconnect metal can be provided in the substrate 13, that is between and making contact therewith electrical traces 46 (in the lower or first surface of substrate 13) and traces 48 (in the upper or second surface of substrate 13). These additional layers have not been shown in the cross sections of FIGS. 2 through 7 since these additional layers are not germane to the invention.

Figure 3:
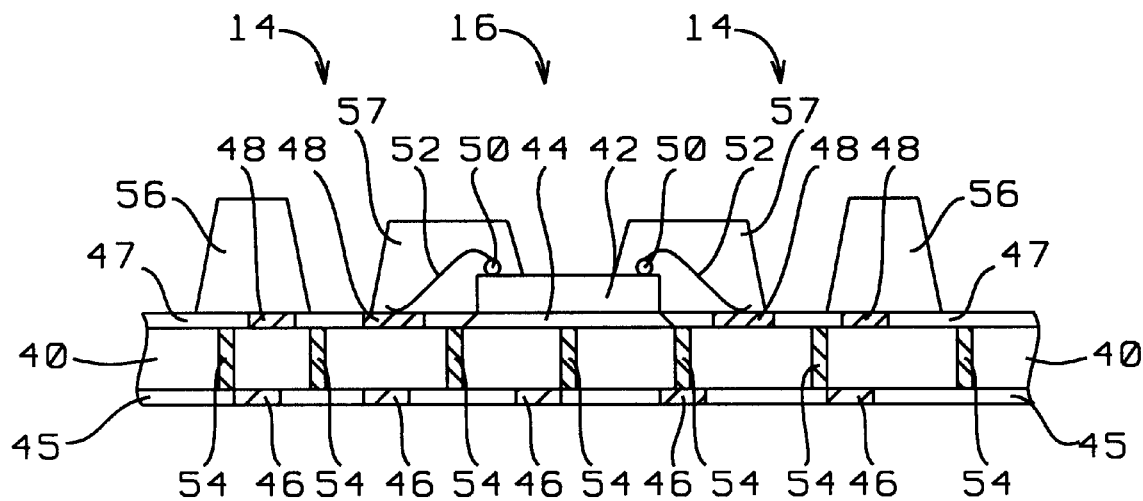

FIG. 3 shows a cross section of the structure after the internal mold cap 57 and the external mold cap 56 have been applied over the surface of the structure. It must be noted in the cross section of FIG. 4 that the internal mold cap 57 has been provided with opening 16 and is mounted aligned with the semiconductor die 42. Opening 16 penetrates through the internal mold cap 57, exposing the surface of die 42. Opening 14 is an opening (or separation or cavity) between the internal mold cap 57 and the external mold cap 56 and completely penetrates to the surface of substrate 40. The surface of die 42 is exposed through the opening 16 that has been created in the internal mold cap 57, the internal mold cap 57 therefore provides an exposed area to the surface of the die 42 of the package.

As an alternate to the above highlighted opening 16, which has been described as penetrating through the internal mold cap 57, the internal mold cap 57 can be designed such that opening 16 does not penetrate through the internal mold cap 57, in which case the surface of die 42 is not exposed.

It must further be noted in the cross section that is shown in FIG. 3 that the external mold cap 56 is higher than the internal mold cap 57 by a measurable amount, this to assure that the package conforms to standard PBGA package designs when the heat sink 60 overlies the internal mold cap 57.

Figure 4:
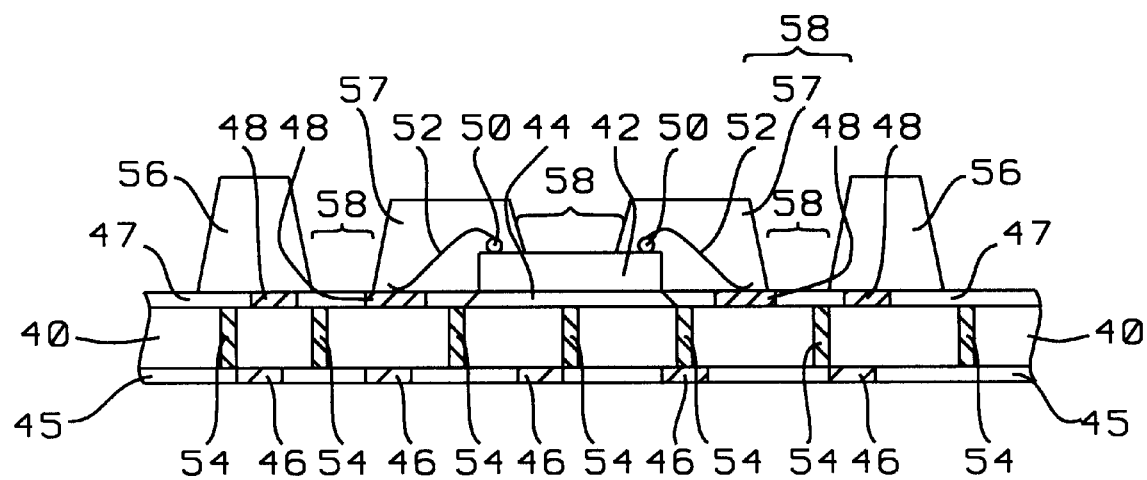

FIG. 4 shows the cross section of the structure of FIG. 3 after the application of conductive epoxy 58 in the opening 14 (created between the internal mold cap 57 and the external mold cap 56) and opening 16 (created through the internal mold cap 57). The amount of conductive epoxy that is deposited into openings 14 and 16 must be of enough volume so that the epoxy 58 makes contact with the thereover to be placed heat spreader of the package.

The cross section that is shown in FIG. 4 makes clear that, because the external mold dam 56 is higher than the internal mold dam 57, the external mold cap serves as a dam during the dispensing of the thermally conductive epoxy 58.

Figure 5:
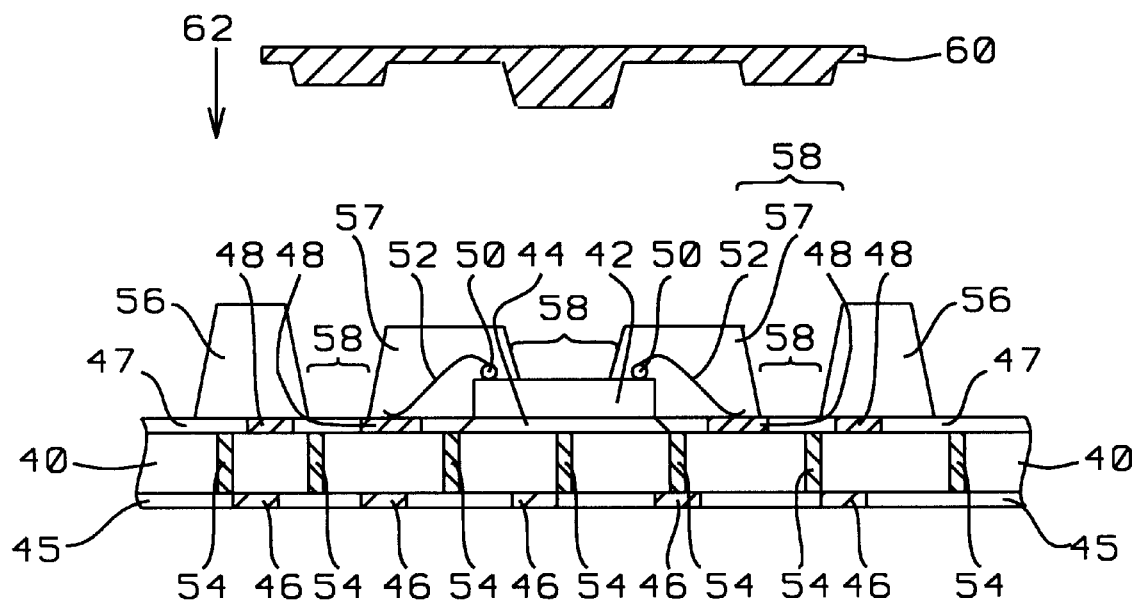

FIG. 5 shows a cross section where heat spreader 60 is placed above and aligned with the surface of the layer 56 of the mold compound. The heat sink 60 is therefore attached to the internal mold cap 57 by the inserted thermally conductive epoxy 58 in the centrally located cavity 16 of the internal mold cap 57. The periphery of the heat spreader is attached to the cavity 14 that is formed between the internal mold cap 57 and the external mold cap 56, thermally conductive epoxy 58 is used for this purpose.

It will be noted in the cross section of FIG. 5 that the lower surface of the heat spreader 60 is not of planar design but has a profile that follows the profile of the openings that have been created in or between the mold caps 56 and 57. The heat spreader 60 is placed on the surface of external mold cap 56 by moving the heat spreader 60 in direction 62.

It must be noted from the cross section that is shown in FIG. 5 that the heat spreader 60 can be attached to ground pads which are provided for this purpose in or on the surface of the underlying substrate 40 where this surface is exposed over the bottom of opening 14. This can be done by using electrically conductive epoxy for epoxy 58, thus forming a ground plane and a partial EMI shield in the package. Interconnect wires can also be used for this purpose using techniques like wire bonding.

Where the cross section of the heat spreader 60 that is shown in FIG. 5 shows a heat spreader that does not horizontally expand beyond the surface of the external mold cap 56, the heat spreader that is used with the package of the invention is not limited to an extension over only the surface of the external mold cap 56 but can expand beyond the surface of the external mold cap 56.

Figure 6:
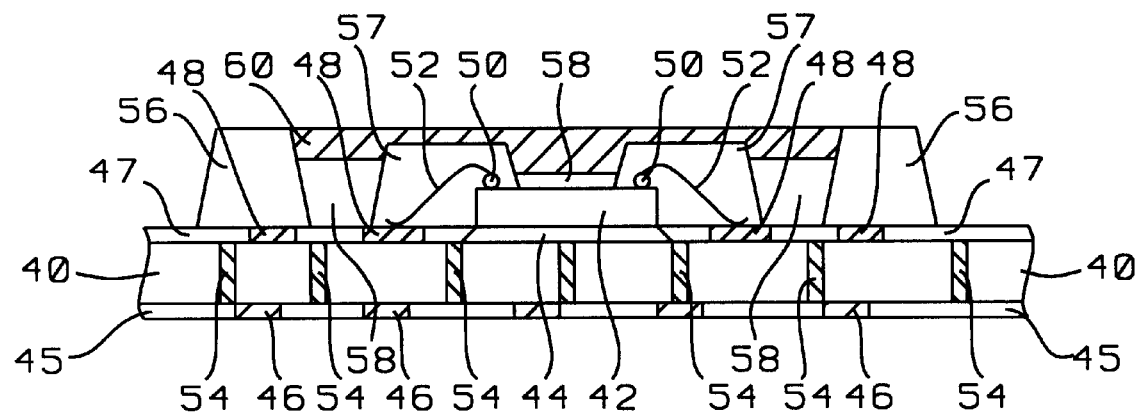

After placement of the heat spreader 60 over the surface of layer 56, the cross section of the structure is as is shown in FIG. 6. The placement of the heat spreader over the surface of layer 56 can be performed either manually or automatically (machine insertion). Pressure can be applied to the heat spreader after insertion in order to assure surface planarity of the completed structure.

Figure 7:
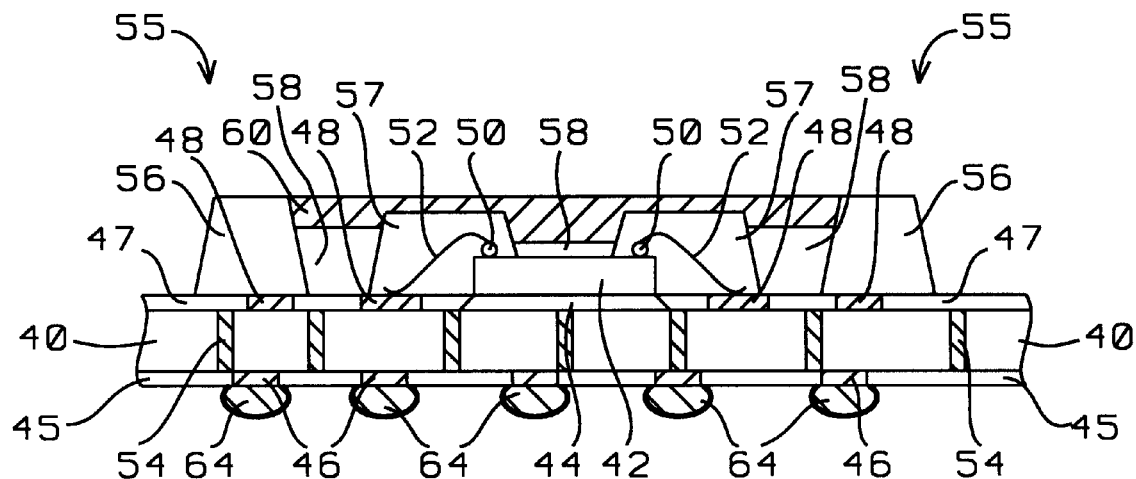

After the structure that is shown in cross section in FIG. 7 has been created, a step of thermal cure is applied to the plastic mold compound 56/57 and the thermal epoxy 58, assuring good adhesion between the heat spreader 60 and the mold compound 57 and between the mold compound 56 and the solder mask 47 created over the second surface of substrate 40.

Attachment of contact balls 64, FIG. 7, completes the PBGA package of the invention. As a final cross section is shown a completed package prior to the attachment of the contact balls 64, the now familiar elements of the package have been highlighted continuing the previously used numbering scheme.

It is clear from the processing sequence that has been highlighted under FIGS. 2 through 7, that the invention provides for a wide range of designs of the profile of the heat spreader. This is made possible by the sequence of the invention whereby the heat sink is added to the package before curing of the mold compound and the epoxy fill.

Figure 8:
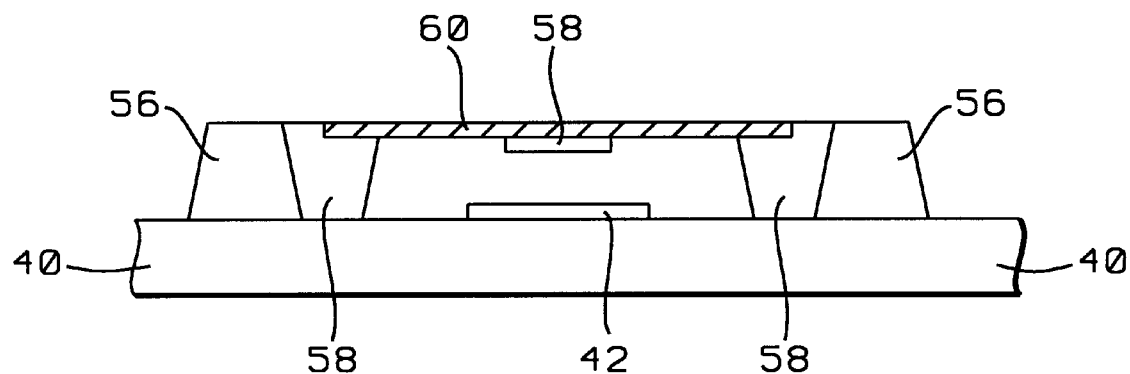
FIG. 8 shows a simplified first cross section of the package of the invention whereby a planar heatsink has been provided.
Figure 9:
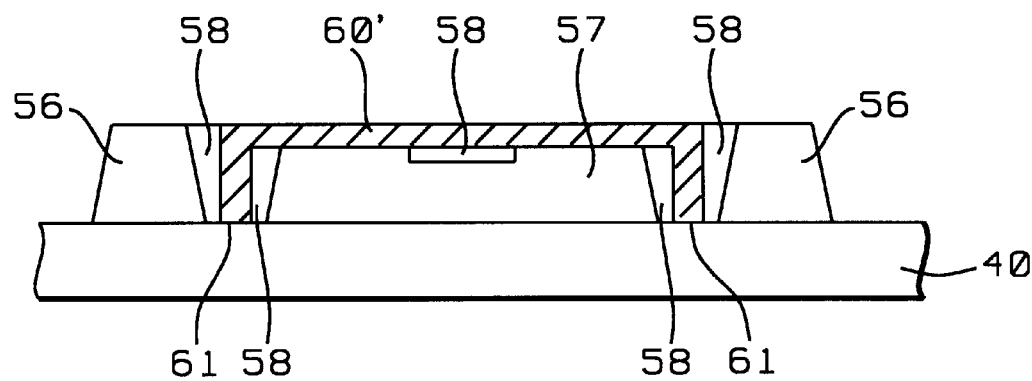
FIG. 9 shows a simplified second cross section of the package of the invention whereby an extended heatsink has been provided.

FIG. 8 shows a simplified cross section of the package of the invention whereby heatsink 60 is no of a planar design. Other elements that have been highlighted in the cross section of FIG. 8 have previously been explained. A cross section that is similar to the cross section of FIG. 8 is shown in FIG. 9, whereby however the heatsink 60' has been provided with downward sloping extremities 61 that reach down to the surface of substrate 40 and that are embedded in a gap between the internal mold cap 57 and the external mold cap 56.

Figure 10A:
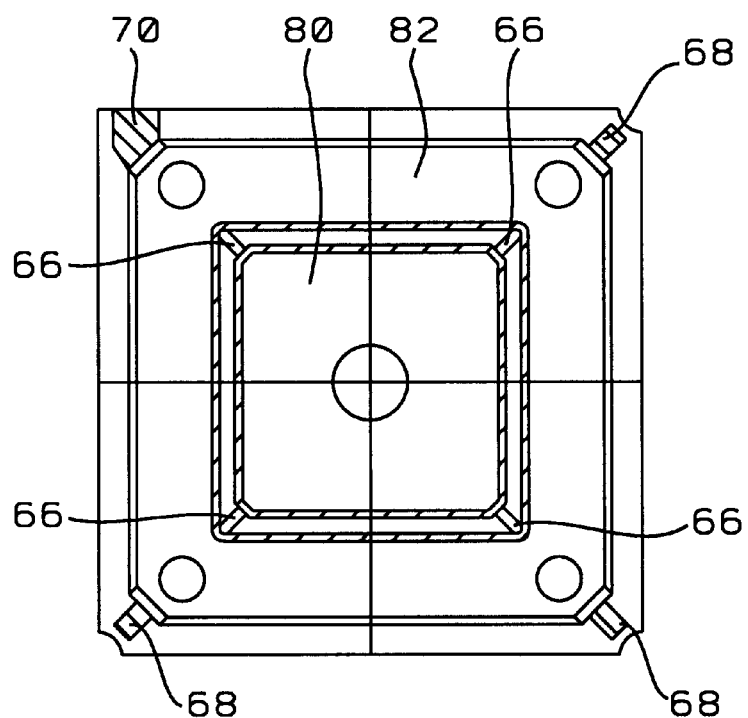
FIGS. 10a and 10b show top views of the package of the invention during formation of an internal and an external mold cap and after heatsink attachment thereover.
Figure 10B:
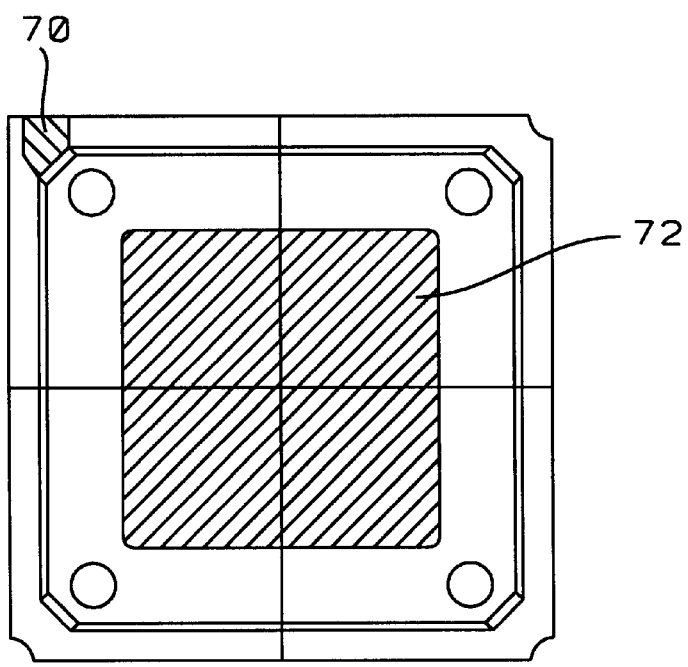

FIGS. 10a and 10b show top views of:

FIG. 10a, the external mold cap (82) and the internal mold cap (80) are created on top of the surface of the substrate (40), and FIG. 10b, the package of the invention after heatsink (72) attachment.

Specifically, the top view that is shown in FIG. 10a is a top view of the package of the invention during the mold process. This top view is shown in order to highlight the following specifics as they relate to the application of the mold compound:

70, an external mold gate used for the creation of the external mold cap 56, FIG. 7

90, an internal mold gate used for the creation of the internal mold cap 57, FIG. 7

68, air vents (three in total) of the external mold gate 82 that are required for the application of the external mold cap 56, FIG. 7, and 66, air vents (three in total) of the internal mold gate 80 that are required for the application of the internal mold cap 57, FIG. 7.

FIG. 10b shows a top view after the heat spreader 72 has been attached to the package of the invention.

FIGS. 10a and 10b can be summarized as follows as providing the ability to:

create an external layer of mold compound (layer 56, FIG. 7), being an external mold cap, comprising at least one external mold gate 70 the external mold gate 70 has been provided with a first plurality of air vents 68, the first plurality of air vents 68 is located around a periphery of the external mold cap 82, the first plurality of air vents 68 releases air (not shown) from the external layer 56, FIG. 7, of mold compound during the process of creating the external layer 56, FIG. 7, of mold compound create an internal layer 57, FIG. 7, of mold compound, being an internal mold cap, comprising at least one internal mold gate 90 the internal mold gate 90 has been provided with a second plurality of air vents 66, the second plurality of air vents 66 is located around a periphery of the internal mold cap 80, the second plurality of air vents 66 releases air (not shown) from the internal layer 57, FIG. 7, of mold compound during the process of creating the internal layer 57, FIG. 7, of mold compound.

The invention can be summarized as follows:

a method and package is provided for the packaging of BGA devices the method uses standard FOL and EOL processing the standard FOL processing is followed by encapsulating the BGA device in a mold compound the mold compound of the package consists of two separate mold caps, an internal mold cap that is surrounding by an external mold cap the external mold cap is higher than the internal mold cap after the device has been encapsulated in a internal and external mold compound, a heat spreader is attached to the surface of the mold compound

- the heat spreader of the invention can be of a suitable design to meet heat transfer requirements
- the heat spreader of the invention can be a heat spreader that overlies the internal mold compound of the package
- the heat spreader of the invention can be a heat spreader that is embedded in the external mold cap of the package
- heat spreading requirements of the package can be met by applying thermally conductive epoxy to the surface of the internal mold cap of the package, and
- the heat spreader of the invention may overlay the mold caps of the package or may complete enclose the mold compound of the package.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

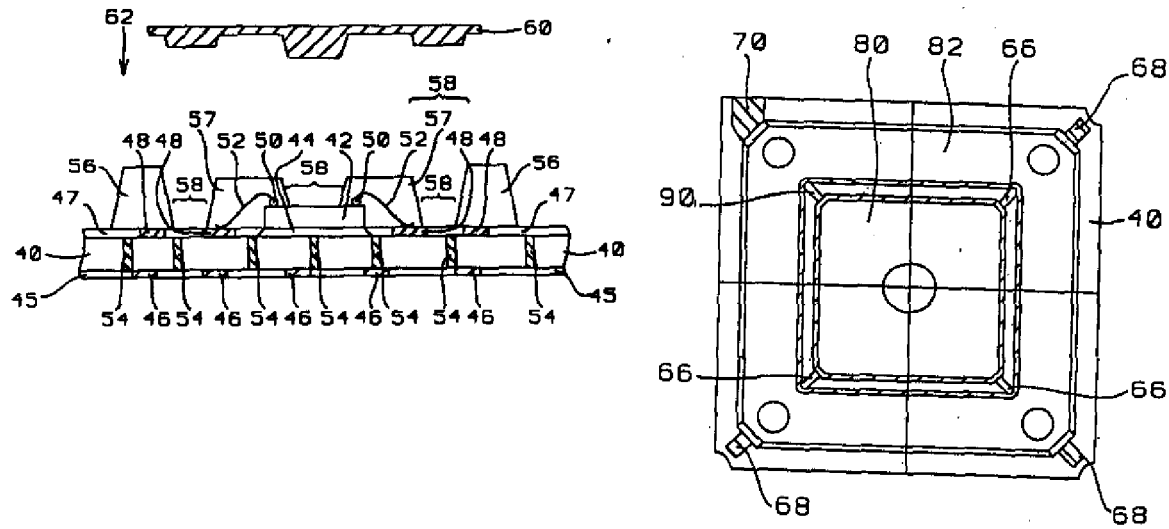

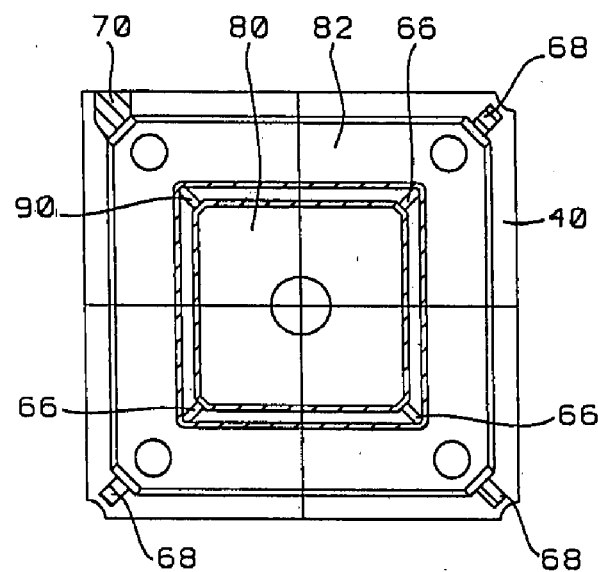
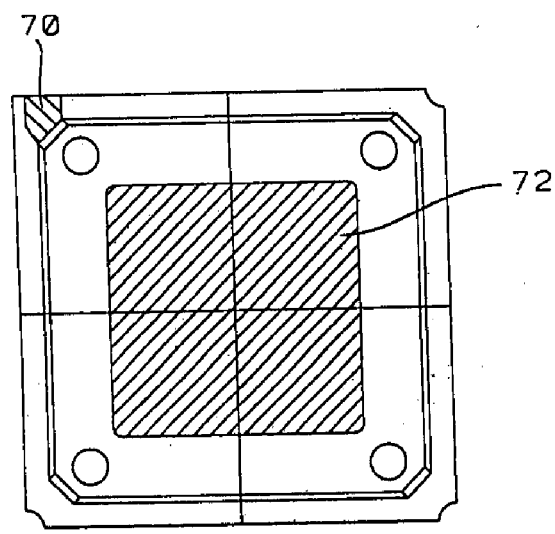

What is claimed is:

1. A method for packaging a semiconductor device, forming a Plastic Ball Grid Array (PBGA) package, comprising the steps of:

providing Front-Of-Line processing of at least one semiconductor device mounted on a semiconductor device mounting support, said semiconductor device mounting support having a first and a second surface;

creating an external layer of mold compound having a first height over the second surface of said semiconductor device mounting support, said external layer of mold compound having been created in a closed loop form at the periphery of said semiconductor device mounting support, said external layer of mold compound having been kept out from said at least one semiconductor device and interconnect wires to said at least one semiconductor device;

creating an internal layer of mold compound having a second height over the second surface of said semiconductor device mounting support, said internal layer of mold compound overlying and surrounding said at least one semiconductor device, at least one opening having been provided in said internal layer of mold compound overlying the surface of said at least one semiconductor device, further encasing said at least one semiconductor device and said interconnect wires to said at least one semiconductor device in said internal layer of mold compound, said internal layer of mold compound having been surrounded by said external layer of mold compound, a cavity having been provided between said internal and said external layers of mold compound, said second height being lower than said first height by a measurable amount, external surfaces of said external layer of mold compound intersecting said semiconductor device mounting support under an angle;

dispensing layers of thermally conductive epoxy in said opening provided in said internal layer of mold compound and in said cavity provided between said external and said internal layers of mold compound;

providing a heat spreader over the surface of said external layer of mold compound, said heat spreader having a first and a second surface, said first surface of said heat spreader facing said at least one semiconductor device, said first surface of said heat spreader having at least one protrusion being aligned with said at least one semiconductor device, thereby converting said internal layer of mold compound into an internal mold cap with reference to said heat spreader, thereby furthermore converting said external layer of mold compound into an external mold cap with reference to said heat spreader; and curing said mold compound concurrent with curing said thermally conductive epoxy.

2. The method of claim 1, said heat spreader comprising metal.

3. The method of claim 1, said heat spreader comprising thermally conductive epoxy.

4. The method of claim 1, said providing Front-Of-Line processing comprising the steps of:

providing a semiconductor device mounting support, said semiconductor device mounting support having been provided with conductive interconnect metal;

mounting at least one semiconductor device over a second surface of said semiconductor device mounting support; and connecting said at least one semiconductor device in a face upward position by facing an active surface of said semiconductor device away from said semiconductor device mounting support, using interconnect wires between said conductive interconnect metal provided for said semiconductor device mounting support and contact points provided in an active surface of said at least one semiconductor device.

5. The method of claim 1, in addition providing end-of-line processing for said packaging of said semiconductor device, said end-of-line processing comprising steps of connecting contact balls to the first surface of said semiconductor device mounting support, completing creation of a Plastic Ball Grid Array (PBGA) package.

6. The method of claim 1, additionally forming a ground plane surrounding said at least one semiconductor device by filling said cavity between said internal and said external layer of mold compound with an electrically conductive epoxy.

7. The method of claim 1, additionally forming a Electro Magnetic Interference (EMI) shield surrounding said at least one semiconductor device by filling said cavity between said internal and said external layer of mold compound with an electrically conductive epoxy.

8. The method of claim 1, said external layer of mold compound being used as a dam during said dispensing layers of thermally conductive epoxy due to said second height exceeding said first height by a measurable amount being used.

9. The method of claim 1, said Plastic Ball Grid Array (PBGA) conforming to standard Plastic Ball Grid Array (PBGA) package dimensions.

10. The method of claim 1, further optimizing heat spreader design in order to improve package thermal performance.

11. The method of claim 1, the second surface of said heat spreader being in a plane with the surface of said second layer of mold compound.

12. The method of claim 11, further providing a connection between said heat spreader and ground pads provided in or on a second surface of said semiconductor device mounting support.

13. The method of claim 12, said connection being provided by interconnect wires mounted in said cavity between said first and said second layer of mold compound.

14. The method of claim 12, said connection being provided by electrically conductive epoxy applied in said cavity between said first and said second layer of mold compound.

15. The method of claim 1, said first surface of said heat spreader extending over the surface of said internal layer of mold compound, further extending over said cavity provided between said internal and said external layer of mold compound, further extending over the surface of said external layer of mold compound.

16. The method of claim 15, further providing a connection between said heat spreader and ground pads provided in or on a second surface of said semiconductor device mounting support.

17. The method of claim 16, said connection being provided by interconnect wires mounted in said cavity between said internal and said external layer of mold compound.

18. The method of claim 16, said connection being provided by electrically conductive epoxy applied in said cavity between said internal and said external layer of mold compound.

19. The method of claim 1, said first surface of said heat spreader expanding beyond the surface of said external layer of mold compound.

20. The method of claim 19, further providing a connection between said heat spreader and ground pads provided in or on a second surface of said semiconductor device mounting support.

21. The method of claim 20, said connection being provided by interconnect wires mounted in said cavity between said internal and said external layer of mold compound.

22. The method of claim 20, said connection being provided by electrically conductive epoxy having been applied in said cavity between said internal and said external layer of mold compound.

23. The method of claim 1, said first surface of said heat spreader extending over the surface of said internal layer of mold compound, further extending over said cavity provided between said internal and said external layer of mold compound, further extending over the surface of said external layer of mold compound, said heat spreader additionally overlying said external surfaces of said external layer of mold compound.

24. The method of claim 23, said heat spreader further being connected to ground pads provided in or on a second surface of said semiconductor device mounting support.

25. The method of claim 24, said connection being provided by interconnect wires mounted in said cavity between said internal and said external layer of mold compound.

26. The method of claim 24, said connection being provided by electrically conductive epoxy having been applied in said cavity between said internal and said external layer of mold compound.

27. The method of claim 1, said at least one opening having been provided in said internal layer of mold compound exposing the surface of said at least one semiconductor device.

28. The method of claim 1, said at least one opening having been provided in said internal layer of mold compound not exposing the surface of said at least one semiconductor device.

29. The method of claim 1, said creating an external layer of mold compound being an external mold cap comprising at least one external mold gate.

30. The method of claim 29, said external mold gate having been provided with a first plurality of air vents, said first plurality of air vents being located around a periphery of said external mold gate, said first plurality of air vents releasing air from the external layer of mold compound during the process of creating said external layer of mold compound.

31. The method of claim 1, said creating an external layer of mold compound being an external mold cap comprising at least one internal mold gate.

32. The method of claim 31, said internal mold gate having been provided with a second plurality of air vents, said second plurality of air vents being located around a periphery of said second mold gate, said second plurality of air vents releasing air from the internal layer of mold compound during the process of creating said internal layer of mold compound.

33. A semiconductor device package, comprising:

a semiconductor device mounting support having a first and a second surface, at least one semiconductor device having been mounted on a second surface of a semiconductor device mounting support, said semiconductor device mounting support having been provided with conductive interconnect metal, said at least one semiconductor device having been mounted in a face upward position by facing an active surface of said semiconductor device away from said semiconductor device mounting support, using interconnect wires between said conductive interconnect metal provided for said semiconductor device mounting support and contact points provided in an active surface of said at least one semiconductor device;

an external layer of mold compound having a first height over the second surface of said semiconductor device mounting support, said external layer of mold compound having been created in a closed loop form at the periphery of said semiconductor device mounting support, said external layer of mold compound having been kept out from said at least one semiconductor device and interconnect wires to said at least one semiconductor device;

an internal layer of mold compound having a second height over the second surface of said semiconductor device mounting support, said internal layer of mold compound overlying and surrounding said at least one semiconductor device, at least one opening having been provided in said internal layer of mold compound overlying the surface of said at least one semiconductor device, further encasing said at least one semiconductor device and said interconnect wires to said at least one semiconductor device in said internal layer of mold compound, said internal layer of mold compound having been surrounded by said external layer of mold compound, a cavity having been provided between said internal and said external layers of mold compound, said second height being lower than said first height by a measurable amount, external surfaces of said external layer of mold compound intersecting said semiconductor device mounting support under an angle;

layers of thermally conductive epoxy dispensed in said opening provided in said first layer of mold compound and in said cavity provided between said first and said external layers of mold compound;

a heat spreader provided over the surface of said first layer of mold compound, said heat spreader having a first and a second surface, said first surface of said heat spreader facing said at least one semiconductor device, said first surface of said heat spreader having at least one protrusion being aligned with said at least one semiconductor device, said internal layer of mold compound comprising an internal mold cap with reference to said heat spreader, said external layer of mold compound furthermore comprising an external mold cap with reference to said heat spreader; and said mold compound having been cured concurrent with curing said thermally conductive epoxy wherein said external and internal layers of mold compound are a different material than said thermally conductive epoxy.

34. The semiconductor device package of claim 33, said heat spreader comprising metal.

35. The semiconductor device package of claim 33, said heat spreader comprising thermally conductive epoxy.

36. The semiconductor device package of claim 33, additionally end-of-line processing having been provided for said package, contact balls having been connected to the first surface of said semiconductor device mounting support, completing creation of a Plastic Ball Grid Array (PBGA) package.

37. The semiconductor device package of claim 33, a Electro Magnetic Interference (EMI) shield additionally having been formed surrounding said at least one semiconductor device by filling said cavity between said internal and said external layer of mold compound with an electrically conductive epoxy.

38. The semiconductor device package of claim 33, said external layer of mold compound having been used as a dam during said dispensing layers of thermally conductive epoxy due to said second height exceeding said first height by a measurable amount being used.

39. The semiconductor device package of claim 33, said package conforming to standard Plastic Ball Grid Array (PBGA) package dimensions.

40. The semiconductor device package of claim 33, said heat spreader design further having been optimized in order to improve package thermal performance.

41. The semiconductor device package of claim 33, said at least one opening having been provided in said internal layer of mold compound exposing the surface of said at least one semiconductor device.

42. The semiconductor device package of claim 33, said first opening having been provided in said internal layer of mold compound not exposing the surface of said at least one semiconductor device.

43. The semiconductor device package of claim 33, the second surface of said heat spreader being in a plane with the surface of said external layer of mold compound.

44. The semiconductor device package of claim 43, further a connection having been provided between said heat spreader and ground pads provided in or on a second surface of said semiconductor device mounting support.

45. The semiconductor device package of claim 44, said connection having been provided by interconnect wires mounted in said cavity between said internal and said external layer of mold compound.

46. The semiconductor device package of claim 44, said connection having been provided by electrically conductive epoxy applied in said cavity between said internal and said external layer of mold compound.

47. The semiconductor device package of claim 33, said first surface of said heat spreader extending over the surface of said internal layer of mold compound, further extending over said cavity provided between said internal and said external layer of mold compound, further extending over the surface of said second layer of mold compound.

48. The semiconductor device package of claim 47, a connection further having been provided between said heat spreader and ground pads provided in or on a second surface of said semiconductor device mounting support.

49. The semiconductor device package of claim 48, said connection having been provided by interconnect wires mounted in said cavity between said internal and said external layer of mold compound.

50. The semiconductor device package of claim 48, said connection having been provided by electrically conductive epoxy applied in said cavity between said internal and said external layer of mold compound.

51. The semiconductor device package of claim 33, said first surface of said heat spreader expanding beyond the surface of said external layer of mold compound.

52. The semiconductor device package of claim 51, a connection further having been provided between said heat spreader and ground pads provided in or on a second surface of said semiconductor device mounting support.

53. The semiconductor device package of claim 52, said connection having been provided by interconnect wires mounted in said cavity between said internal and said external layer of mold compound.

54. The semiconductor device package of claim 52, said connection having been provided by electrically conductive epoxy having been applied in said cavity between said internal and said external layer of mold compound.

55. The semiconductor device package of claim 33, said first surface of said heat spreader extending over the surface of said internal layer of mold compound, further extending over said cavity provided between said internal and said external layer of mold compound, further extending over the surface of said external layer of mold compound, said heat spreader additionally overlying said external surfaces of said external layer of mold compound.

56. The semiconductor device package of claim 55, said heat spreader further having been connected to ground pads provided in or on a second surface of said semiconductor device mounting support.

57. The semiconductor device package of claim 56, said connection having been provided by interconnect wires mounted in said cavity between said internal and said external layer of mold compound.

58. The semiconductor device package of claim 56, said connection having been provided by electrically conductive epoxy having been applied in said cavity between said internal and said external layer of mold compound.

59. The semiconductor device package of claim 33, said external layer of mold compound being an external mold cap having been created applying at least one external mold gate.

60. The semiconductor device package of claim 59, said external mold gate having been provided with a first plurality of air vents, said first plurality of air vents being located around a periphery of said external mold cap, said first plurality of air vents releasing air from the external layer of mold compound during the process of creating said external layer of mold compound.

61. The semiconductor device package of claim 33, said internal layer of mold compound being an internal mold cap having been created applying at least one internal mold gate.

62. The package of claim 61, said internal mold gate having been provided with a second plurality of air vents, said second plurality of air vents being located around a periphery of said internal mold cap, said second plurality of air vents releasing air from the internal layer of mold compound during the process of creating said internal layer of mold compound.

63. The semiconductor device package of claim 33, a ground plane additionally surrounding said at least one semiconductor device by filling said cavity between said internal and said external layer of mold compound with an electrically conductive epoxy.

* * * * *

UNITED STATES PATENT AND TRADEMARK OFFICE
CERTIFICATE OF CORRECTION

PATENT NO. : 6,534,859 B1
DATED : March 18, 2003
INVENTOR(S) : Shim et al.

It is certified that error appears in the above-identified patent and that said Letters Patent is hereby corrected as shown below:

The title page showing an illustrative figure, should be deleted and subsitute therefore the attached title page.

Delete drawing sheet Fig 5 and substitute therefor the drawing sheet consisting of Fig 5 as shown on the attached pages Signed and Sealed this Twenty-second Day of March, 2005

JON W. DUDAS
*Director of the United States Patent and Trademark Office*

(12) United States Patent
Shim et al.

(10) Patent No.: US 6,534,859 B1
(45) Date of Patent: Mar. 18, 2003

(54) SEMICONDUCTOR PACKAGE HAVING HEAT SINK ATTACHED TO PRE-MOLDED CAVITIES AND METHOD FOR CREATING THE PACKAGE

(75) Inventors: Il Kwon Shim, Singapore (SG); Seng Guan Chow, Singapore (SG); Gerry Balanon, San Jose, CA (US)

(73) Assignee: St. Assembly Test Services Ltd., Singapore (SG)

(*) Notice: Subject to any disclaimer, the term of this patent is extended or adjusted under 35 U.S.C. 154(b) by 0 days.

(21) Appl. No.: 10/116,983

(22) Filed: Apr. 5, 2002

(51) Int. Cl.[7] .................. H01L 23/495; H01L 23/10; H01L 23/28; H01L 21/50
(52) U.S. Cl. .................. 257/706; 257/675; 257/707; 257/787; 257/796; 257/783; 257/719; 438/124; 438/126; 438/127; 438/106; 438/122
(58) Field of Search .................. 257/675, 707, 257/787, 796, 783, 706, 719; 438/124, 126, 127, 106

(56) References Cited

U.S. PATENT DOCUMENTS

| | | | |
|---|---|---|---|
| 5,227,663 A | * 7/1993 | Patil et al. | 257/718 |
| 5,371,404 A | * 12/1994 | Juskey et al. | 257/659 |
| 5,641,987 A | 6/1997 | Lee | 257/675 |
| 5,785,799 A | * 7/1998 | Culnane et al. | 156/379.7 |
| 5,834,839 A | 11/1998 | Mertol | 257/704 |
| 5,866,953 A | * 2/1999 | Akram et al. | 257/790 |
| 5,872,395 A | 2/1999 | Fujimoto | 257/675 |
| 5,891,753 A | * 4/1999 | Akram | 438/108 |
| 5,977,626 A | * 11/1999 | Wang et al. | 257/707 |
| 6,069,023 A | * 5/2000 | Bernier et al. | 438/107 |
| 6,150,193 A | * 11/2000 | Glenn | 438/113 |
| 6,191,360 B1 | * 2/2001 | Tao et al. | 174/52.4 |
| 6,201,301 B1 | 3/2001 | Hoang | 257/712 |
| 6,229,702 B1 | * 5/2001 | Tao et al. | 361/704 |
| 6,316,829 B1 | * 11/2001 | Boon et al. | 257/730 |
| 6,462,405 B1 | * 10/2002 | Lai et al. | 257/675 |

* cited by examiner

*Primary Examiner*—Albert W. Paladini
*Assistant Examiner*—James Mitchell
(74) *Attorney, Agent, or Firm*—George O. Saile; Stephen B. Ackerman

(57) ABSTRACT

A new method and package is provided for face-up packaging of semiconductor devices. The semiconductor device is mounted over the surface of a semiconductor device support surface using conventional methods of device packaging up through device bond wire interconnect to electrical traces on the surface of the semiconductor device support surface over which the device is mounted. An internal mold cap is formed over the device, the internal mold cap has an opening exposing the surface of the device. An external mold cap is formed surrounding the internal mold cap with a cavity separating the external mold cap from the internal mold cap. Thermally conductive epoxy is deposited in the opening of the internal mold cap and in the cavity between the internal and the external mold cap. The heat spreader is placed and attached after which a thermal epoxy and mold cure is applied to the package. The package is further completed by the application of contact balls to a first surface of the semiconductor device support surface, the semiconductor devices is mounted has been mounted over a second surface of the semiconductor device support surface.

63 Claims, 5 Drawing Sheets